(12) United States Patent
Kumagai et al.

(10) Patent No.: US 6,934,139 B2
(45) Date of Patent: Aug. 23, 2005

(54) INTELLIGENT POWER MODULE

(75) Inventors: Naoki Kumagai, Nagano (JP); Kazunori Oyabe, Nagano (JP); Naotaka Matsuda, Nagano (JP)

(73) Assignee: Fuji Electric Device Technology Co., Ltd. (JP)

( * ) Notice: Subject to any disclaimer, the term of this patent is extended or adjusted under 35 U.S.C. 154(b) by 492 days.

(21) Appl. No.: 09/845,787

(22) Filed: May 1, 2001

(65) Prior Publication Data

US 2002/0039269 A1 Apr. 4, 2002

(30) Foreign Application Priority Data

May 1, 2000 (JP) .................................... 2000-137154

(51) Int. Cl.$^7$ ............................................. H02H 5/04
(52) U.S. Cl. .................................. 361/103; 361/93.1
(58) Field of Search ............................... 361/103, 93.1, 361/93.8, 120; 318/471, 117; 363/56.04, 56.03

(56) References Cited

U.S. PATENT DOCUMENTS

| | | | | |
|---|---|---|---|---|
| 3,427,526 A | * | 2/1969 | Kernick ....................... 363/49 |
| 5,115,388 A | * | 5/1992 | Shigekane ................ 363/56.03 |
| 5,543,994 A | | 8/1996 | Wilhelm et al. .............. 361/18 |
| 5,615,102 A | * | 3/1997 | Daijo ......................... 363/132 |
| 5,648,008 A | * | 7/1997 | Barritt et al. ................ 219/626 |
| 6,094,026 A | * | 7/2000 | Cameron ..................... 318/471 |
| 6,191,625 B1 | * | 2/2001 | Wachter et al. ............. 327/108 |
| 6,590,794 B1 | * | 7/2003 | Carter .......................... 363/98 |

OTHER PUBLICATIONS

M. Mano, Computer System Architecture, 1982, Prentice-Hall, Inc., 2nd Edition, pp. 421–426.*

* cited by examiner

Primary Examiner—Stephen W. Jackson
Assistant Examiner—Zeev Kitov
(74) Attorney, Agent, or Firm—Rossi, Kimms & McDowell, LLP (57) ABSTRACT

An intelligent power module includes semiconductor switching devices, drive circuits, a variety of detecting circuits and warning circuits for detecting a fatal abnormal condition and a precursory abnormal condition thereof in the switching devices, the drive circuits and so forth, abnormal condition detecting logic devices and drive circuits for protecting the switching devices when the detecting circuits and the warning circuits detect the abnormal condition, and control circuits and a transmission circuit for outputting a signal based on detection of the abnormal condition. The transmission circuit has an output terminal for outputting alarm signals when the fatal abnormal condition is detected, and an output terminal for outputting abnormality factor discrimination signals indicating abnormality factors contributing to the fatal abnormal condition and the precursory abnormal condition.

19 Claims, 7 Drawing Sheets

INTELLIGENT POWER MODULE

FIELD OF THE INVENTION

The present invention relates to a power module for use in a power converter such as a pulse width modulator inverter and an uninterruptive power supply, and more particularly to an intelligent power module that has built-in power semiconductor switching devices and drive circuits and protective circuits.

BACKGROUND OF THE INVENTION

Figure 6:
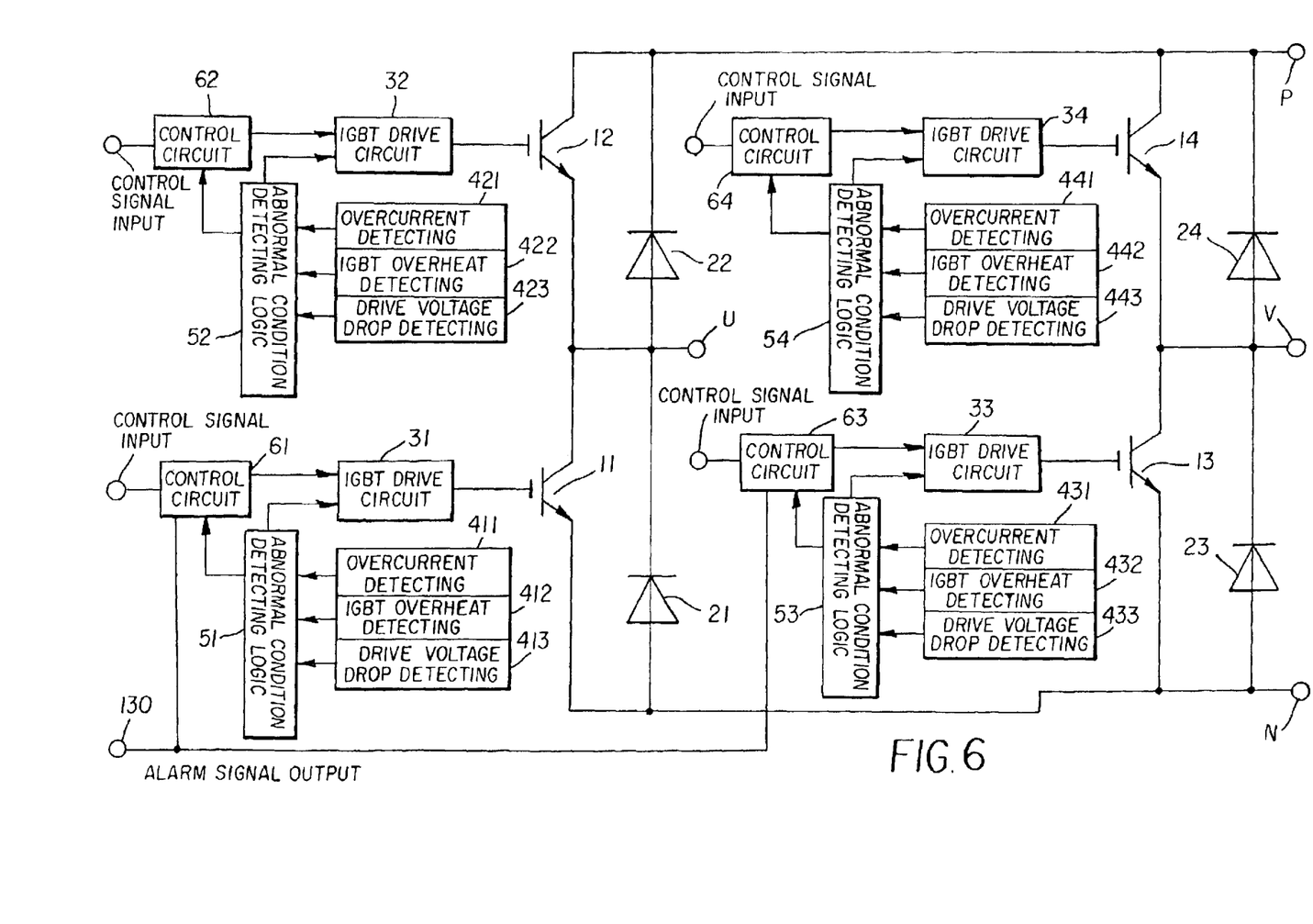
FIG. 6 is a block diagram of a conventional IPM.

FIG. 6 is a block diagram showing the circuit arrangement of a conventional intelligent power module (IPM). The IPM shown in FIG. 6 has a single phase for the sake of convenience in explanation although an ordinary IPM has three phases.

In FIG. 6, reference numerals 11–14 denote insulated gate bipolar transistors (IGBTs) as semiconductor switching devices connected in a bridge connection to constitute a pulse width modulator (PWM) inverter for example; 21–24, freewheeling diodes (FWD) connected to the IGBTs 11–14 in reverse parallel; 31–34, drive circuits for driving the IGBTs 11–14; 61–64, control circuits for controlling the IGBT drive circuits 31–34; 411, 421, 431 and 441, overcurrent detecting circuits for detecting overcurrent flowing through the IGBTs 11–14 when upper and lower arms are shorted or the output terminals are grounded; 412, 422, 432 and 442, overheat detecting circuits for the IGBTs 11–14; 413, 423, 433 and 443, drive voltage drop detecting circuits for detecting a drop in control power supply voltage required for driving the IGBTs 11–14; and 51–54, abnormal condition detecting logic devices for transmitting a cut-off signal to the drive circuits 31–34 via the control circuits 61–64 and outputting an alarm signal to the outside. In a main circuit of the inverter, symbols P and N indicate direct current input terminals and symbols U and V indicate alternating current output terminals.

In FIG. 6, the control circuits 61–64 turn on and off the IGBTs 11–14 through the IGBT drive circuits 31–34 according to a signal (control signal) from an isolated type signal transmission device, not shown, such as a photo-coupler that performs photo-isolation.

As stated previously, upon detection of at least one abnormal condition detecting signal from the detecting circuits, the abnormal condition detecting logic devices 51–54 determine that a condition is fatally abnormal (major failure) and then cut off the IGBTs 11–14 through the IGBT drive circuits 31–34. In this case, all the IGBTs 11–14 may be cut off according to an output signal from one of the abnormal condition detecting logic devices.

The abnormal condition detecting logic devices 51–54 then output alarm signals from an alarm signal output terminal 130 via the control circuits 61–64 in order to inform the outside of the abnormal condition. As a safety precaution, the alarm signals are outputted to the outside after they are isolated by the photo-coupler or the like.

In FIG. 6, only the abnormal condition detecting logic devices 51, 53 in the lower arm output the alarm signals through a wired OR; however, the abnormal condition detecting logic devices 52, 54 may also output abnormal condition detecting signals as alarm signals that are isolated in advance.

Another known a metal oxide semiconductor (MOS) gate driver circuit disclosed is in Japanese Patent No. 2,886,495.

This MOS gate driver circuit is used for a high voltage switching circuit and is capable of detecting overcurrent, cutting off devices and outputting an alarm signal indicating the overcurrent.

According to the prior art shown in FIG. 6, only one kind of alarm signal is outputted. For this reason, if the IPM has three phases, it is impossible to recognize from the outside which phase among the six IGBTs and the freewheeling diodes is exposed to what kind of abnormal condition. The recognition of a position (e.g. phase and device) under the abnormal condition and factors contributing to the abnormal condition makes it easier to eliminate those factors. Accordingly, it would be desirable to output signals indicating a position under an abnormal condition and abnormality factors.

Moreover, the detection of a precursory phenomenon of a fatal abnormal condition enables a trip-free operation (i.e. an operation in which the devices are not cut off). Accordingly, it would be desirable to discriminate the abnormality factors. In the trip-free operation, for example, a warning signal is outputted when the temperature of the IGBT exceeds a slightly lower value than a threshold value at which the temperature of the IGBT is fatally abnormal. When the warning signal is outputted, the maximum value of current flowing through the devices is restrained or the frequency of carriers is lowered. This prevents the increase in temperature of the IGBT to a fatally abnormal level, thereby protecting the IGBT from overheating.

If, however, the abnormality factors are discriminated according to the abnormal condition detecting signals as alarm signals outputted from the respective phases, it is necessary to provide a large number of output terminals for outputting the alarm signals and to provide a large number of isolation photo-couplers as a safety precaution. This results in a high cost.

Further, the construction of a system must be changed in order that the IPM capable of outputting various kinds of alarm signals according to abnormality factors, and in order that the system is compatible with the conventional IPM capable of outputting only one kind of alarm signals.

In addition, the MOS gate driver circuit disclosed in the Japanese Patent No. 2,886,495 detects an overcurrent flowing through devices and outputting alarm signals indicating the overcurrent, but does not detect other abnormality factors or a precursory abnormal condition.

It would also be desirable to provide an IPM that is compatible with the conventional system which does not discriminate abnormality factors, and that is capable of outputting various kinds of abnormality factors when there is a request from the outside to discriminate various kinds of abnormality factors contributing to a fatal abnormal condition and a precursory abnormal condition.

It would further be desirable to provide an IPM that is capable of outputting alarm signals indicating a fatal abnormal condition and warning signals indicating a precursory abnormal condition from separate output terminals or the same output terminal and then discriminating abnormality factors according to combinations of logic states of those output signals.

SUMMARY OF THE INVENTION

An intelligent power module is provided which comprises power semiconductor switching devices, driving means for driving the switching devices, abnormal condition detecting means (e.g. drive voltage drop detecting circuits, drive voltage drop warning circuits, device overheat detecting circuits, overheat warning circuits and overcurrent detecting circuits in embodiments described later) for detecting a fatal abnormal condition and a precursory abnormal condition thereof in the switching devices or the driving means, protecting means (e.g. abnormal condition detecting logic devices and device drive circuits for cutting off devices) for protecting the switching devices when the abnormal condition detecting means detects the abnormal condition, and abnormal condition output means (e.g. a transmission circuit) for outputting signals based on an abnormal condition detecting signals outputted from the abnormal condition detecting means to outside.

The abnormal condition detecting means includes: an output terminal for outputting alarm signals when the abnormal condition detecting means detects the fatal abnormal condition; and an output terminal for outputting abnormality factor discrimination signals indicating abnormality factors contributing to the fatal abnormal condition and the precursory abnormal condition.

In a preferred embodiment of the invention, the abnormality factor discrimination signals are outputted as serial signals.

In another preferred embodiment of the invention, the output terminal for outputting the alarm signals and the output terminal for outputting the abnormality factor discrimination signals are the same terminal. Therefore, the abnormality factor discrimination signals are outputted as serial signals after the alarm signals are outputted.

In another preferred embodiment of the invention, the abnormality factor discrimination signals are outputted in synchronism with an abnormality factor output request signal inputted from outside. More specifically, the abnormality factor discrimination signals relating to the fatal abnormal condition and the precursory abnormal condition are outputted to the outside with the abnormality factor output request signal being used as a read clock.

In another preferred embodiment of the invention, the abnormality factor output request signal includes a transmission preparation signal having a predetermined cycle, the transmission preparation signal updating the abnormality factor discrimination signals stored in parallel-in/serial-out shift registers in the abnormal condition output means, and a read clock following the transmission preparation signal causes the shift registers to output the abnormality factor discrimination signals. According to the transmission preparation signal, the data (abnormality factor discrimination signals) in the parallel-in/serial-out shift register inside the transmission circuit and the like are updated, and the subsequent read clock causes the abnormality factor discrimination signals to be sequentially outputted as serial signals.

In another preferred embodiment of the invention, if the fatal abnormal condition is developed, the abnormal condition output means outputs alarm signals irrespective of whether the abnormality factor output request signal exists or not, and if the precursory abnormal condition is developed, the abnormal condition output means outputs the abnormality factor discrimination signals separately in time in synchronism with the abnormality factor output request signal.

More specifically, the alarm signal indicating the fatal abnormal condition is outputted even in the case where no abnormality factor output request signal is inputted. If the precursory abnormal condition is developed, the abnormality factor discrimination signal is not outputted until the abnormality factor output request signal is inputted.

In another preferred embodiment of the invention, if the fatal abnormal condition is developed, the semiconductor switching devices cut off themselves.

In another preferred embodiment of the invention, the semiconductor switching devices are connected in single-phase bridge connection.

In another preferred embodiment of the invention, the semiconductor switching devices are connected in three-phase bridge connection.

In another preferred embodiment of the invention, the abnormal condition detecting signals from the abnormal condition detecting means corresponding to semiconductor switching devices connected in bridge connection in an upper arm are transmitted to a lower arm through high voltage level shifters. The abnormal condition detecting signals thus outputted are transmitted with the abnormal condition detecting signals in the lower arm to the abnormality condition output means, or are used to cut off the semiconductor switching devices in the lower arm at the same time.

In another preferred embodiment of the invention, the high voltage level shifters perform parallel transmission of multiple abnormal condition detecting signals.

In another preferred embodiment of the invention, the multiple abnormal condition detecting signals are encoded and are parallel transmitted by the high voltage level shifters.

In another preferred embodiment of the invention, the multiple abnormal condition detecting signals are converted into serial signals and are serial-transmitted by the high voltage level shifters.

In another preferred embodiment of the invention the intelligent power module, includes power semiconductor switching devices, driving means for driving the switching devices, abnormal condition detecting means (e.g. drive voltage drop detecting circuits, drive voltage drop warning circuits, device overcurrent detecting circuits, overheat detecting circuits, overheat warning circuits in embodiments described later) for detecting a fatal abnormal condition and a precursory abnormal condition thereof in the switching devices or the driving means, protecting means (e.g. abnormal condition detecting logic devices and device drive circuits for cutting off devices) for protecting the switching devices when the abnormal condition detecting means detects the abnormal condition, and an abnormal condition output means (e.g. a transmission circuit) for outputting signals based on abnormal condition detecting signals outputted from the abnormal condition detecting means to outside.

In another preferred embodiment of the invention, the abnormal condition detecting means comprises: an output terminal for outputting alarm signals when the abnormal condition detecting means detects the fatal abnormal condition; and an output terminal for outputting warning signals when the abnormal condition detecting means detects the precursory abnormal condition. With this arrangement, abnormality factors are discriminated according to combinations of output signals from the respective output terminals.

In another preferred embodiment of the invention, the semiconductor switching devices are connected in bridge connection, and the alarm signals are generated by obtaining a logical sum of the abnormal condition detecting signals indicating the fatal abnormal condition from the abnormal condition detecting means corresponding to the semiconductor switching devices in an upper arm and the abnormal condition detecting signals indicating the fatal abnormal condition from the abnormal condition detecting means corresponding to the semiconductor switching devices in a lower arm; and the warning signals are generated by obtaining a logical sum of the abnormal condition detecting signals indicating the precursory abnormal conditions from the abnormal condition detecting means corresponding to the semiconductor switching devices in the upper arm and the abnormal condition detecting signals indicating the precursory abnormal condition from the abnormal condition detecting means corresponding to the semiconductor switching devices in the lower arm. The abnormality factors such as the drop in drive voltage and the overheating of the devices are discriminated according to combinations of logic states of the alarm signals and the warning signals.

BRIEF DESCRIPTION OF THE DRAWINGS

The invention will now be described with reference to certain preferred embodiments thereof and the accompanying drawings, wherein.

DETAILED DESCRIPTION OF THE INVENTION

Figure 1:
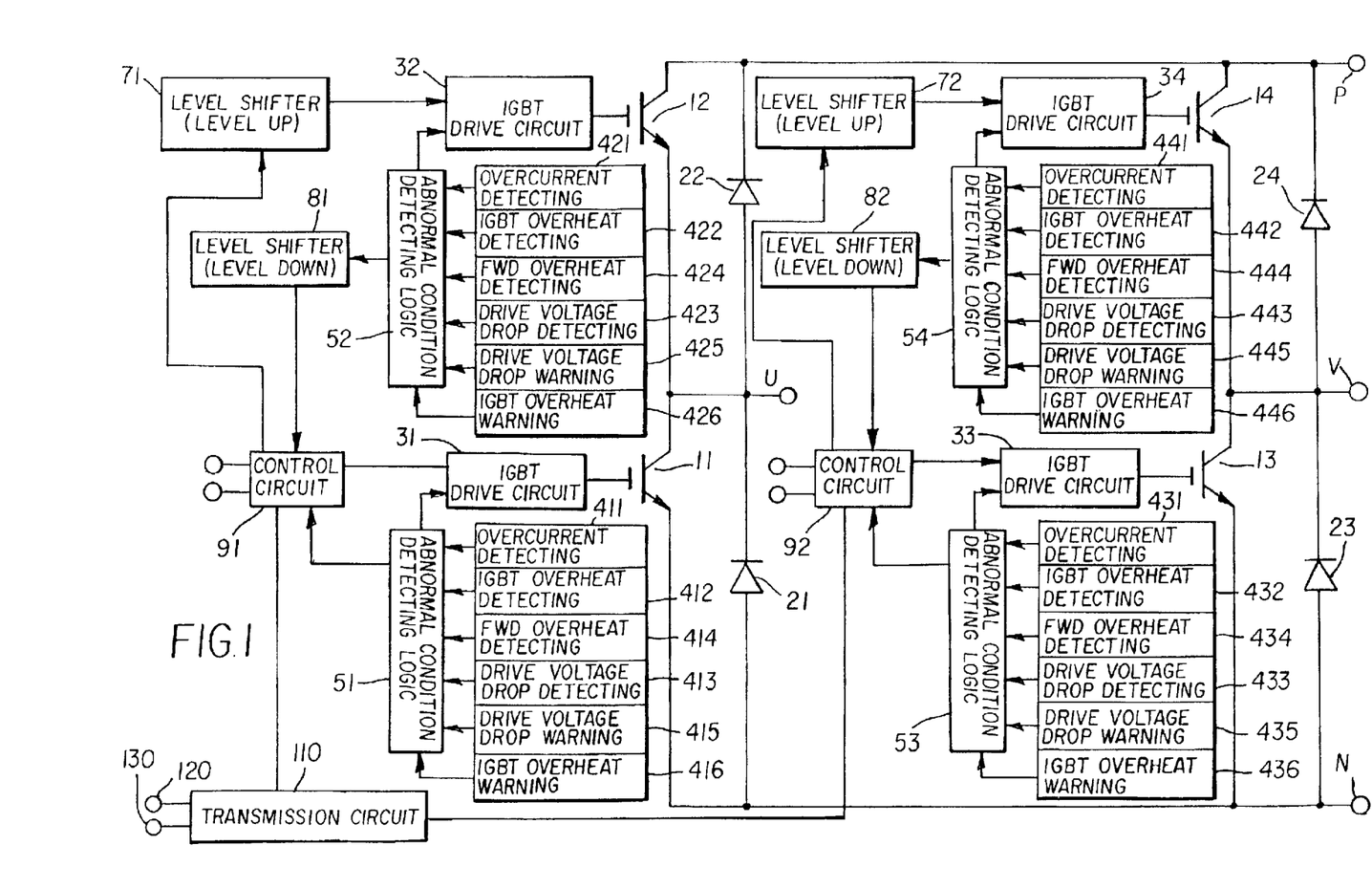
FIG. 1 is a block diagram of an IPM in accordance with the first embodiment of the present invention.

FIG. 1 is a block diagram showing a circuit arrangement of an intelligent power module according to the first embodiment of the present invention. Parts similar to those described with reference to FIG. 6 are denoted by the same reference numerals. In embodiments described with reference to FIGS. 1 and 3 to 5, signals are parallel transmitted in signal transmission paths, which are indicated by thick arrows, between blocks.

According to the present embodiment, each phase is provided with single control circuits (lower arm control circuits) 91, 92. IGBTs 12, 14 in an upper arm are turned on and off according to control signals that are inputted to IBGT drive circuits 32, 34 from the control circuits 91, 92 through high voltage level shifters 71, 72, which are comprised of a high voltage IC and the like. IGBTs 11, 13 in a lower arm are turned on and off according to control signals, which are inputted to IGBT drive circuits 31, 33 directly from the control circuits 91, 92.

With the above arrangement, the IGBTs 12, 14 are turned on and off according to the control signals (level shift signals) based on the control signals inputted to the IGBTs 11, 13 in the lower arm. The control signals are normally transmitted as short ON pulses or OFF pulses in order to reduce losses in the level shifters 71, 72, and are then reconverted into condition signals by SR (set/reset) flip-flop circuits in the level shifters 71, 72. The condition signals are then transmitted to the IBGT drive circuits 32, 34.

According to the present embodiment, freewheeling diode (FWD) overheat detecting circuits 414, 424, 434, 444; drive voltage drop warning circuits 415, 425, 435, 445; and IGBT overheat warning circuits 416, 426, 436, 446 in addition to the detecting circuits shown in FIG. 6 are provided as detecting circuits for the respective IGBTs 11–14. The drive voltage drop warning circuits 415, 425, 435, 445 and the IGBT overheat warning circuits 416, 426, 436, 446 determine that a precursory abnormal condition is developed when a drop in drive voltage or a temperature of the IGBT reaches a lower threshold value (a higher threshold value in the case of the drop in drive voltage) than a value at which the drop in drive voltage or the temperature of the IGBT is determined as being fatally abnormal.

In the following description of the present embodiment, output signals from overcurrent detecting circuits 411, 421, 431, 441, overheat detecting circuits 412, 422, 432, 442, drive voltage drop detecting circuits 413, 423, 433, 443, and the free-wheeling diode (FWD) overheat detecting circuits 414, 424, 434, 444 will be referred to as alarm signals, and output signals from the drive voltage drop warning circuits 415, 425, 435, 445, and the IGBT overheat warning circuits 416, 426, 436, 446 will be referred to as warning signals. Both the alarm signals and the warning signals will collectively be referred to as abnormal condition detecting signals.

High voltage level shifters 81, 82, which are comprised of a high voltage IC and the like, are provided at transmitting sides of abnormal condition detecting logic devices 52, 54 in the upper arm. Output signals from the level shifters 81, 82 are inputted to the control circuits 91, 92. The level shifters 81, 82 convert the level of the abnormal condition detecting signal in the upper arm (at a high potential side of a direct current) into the same level as a level in the lower arm (at a low potential side of a direct current).

Only when the abnormal condition detecting logic devices 51–54 in the upper and lower arms receive at least one alarm signal that is outputted when a fatal abnormal condition is developed, they cut off the IGBTs 11–14 through the drive circuits 31–34 for a predetermined period of time. When the abnormal condition detecting logic devices 51–54 receive the warning signal, they do not cut off the IGBTs 11–14.

More specifically, when the abnormal condition detecting logic devices 52, 54 in the upper arm receive the alarm signal, the IGBT drive circuits 32, 34 cut off the IGBTs for a predetermined period of time. When the abnormal condition detecting logic devices 52, 54 receive the abnormal condition detecting signals (alarm signals or warning signals), the abnormal condition detecting signals are transmitted to the control circuits 91, 92 through the level shifters 81, 82, and are then latched. After the alarm signals are latched, the control circuits 91, 92 output OFF signals for turning off the IGBTs 12, 14 in the upper arm to the level shifters 71, 72 and prohibit the upper arm from being turned on again.

When the abnormal condition detecting logic devices 51, 53 in the lower arm receive the alarm signal indicating the fatal abnormal condition, the IGBT drive circuits 31, 33 cut off the IGBTs 11, 13 for a predetermined period of time. If the abnormal condition detecting logic devices 51, 53 receive the abnormal condition detecting signals (alarm signals or warning signals), the abnormal condition detecting signals are transmitted to the control circuits 91, 92 and are then latched. After the alarm signals are latched, the control circuits 91, 92 output OFF signals for turning off the IGBTs 11, 13 to the IGBT drive circuits 31, 33 and prohibit the IGBTs 11, 13 from being turned on again.

The abnormal condition detecting signals latched by the control circuits 91, 92 are held until they are reset according to a power supply ON reset signal or a reset signal from the outside, which is not illustrated.

When the transmission circuit 110 receives an abnormality factor output request signal from a system through an input terminal 120, it reads a later-described abnormality factor discrimination signal among the abnormal condition detecting signals latched by the control circuits 91, 92 and outputs the read abnormality factor discrimination signal through an alarm signal output terminal 130 in synchronism with the abnormality factor output request signal.

Figure 2:
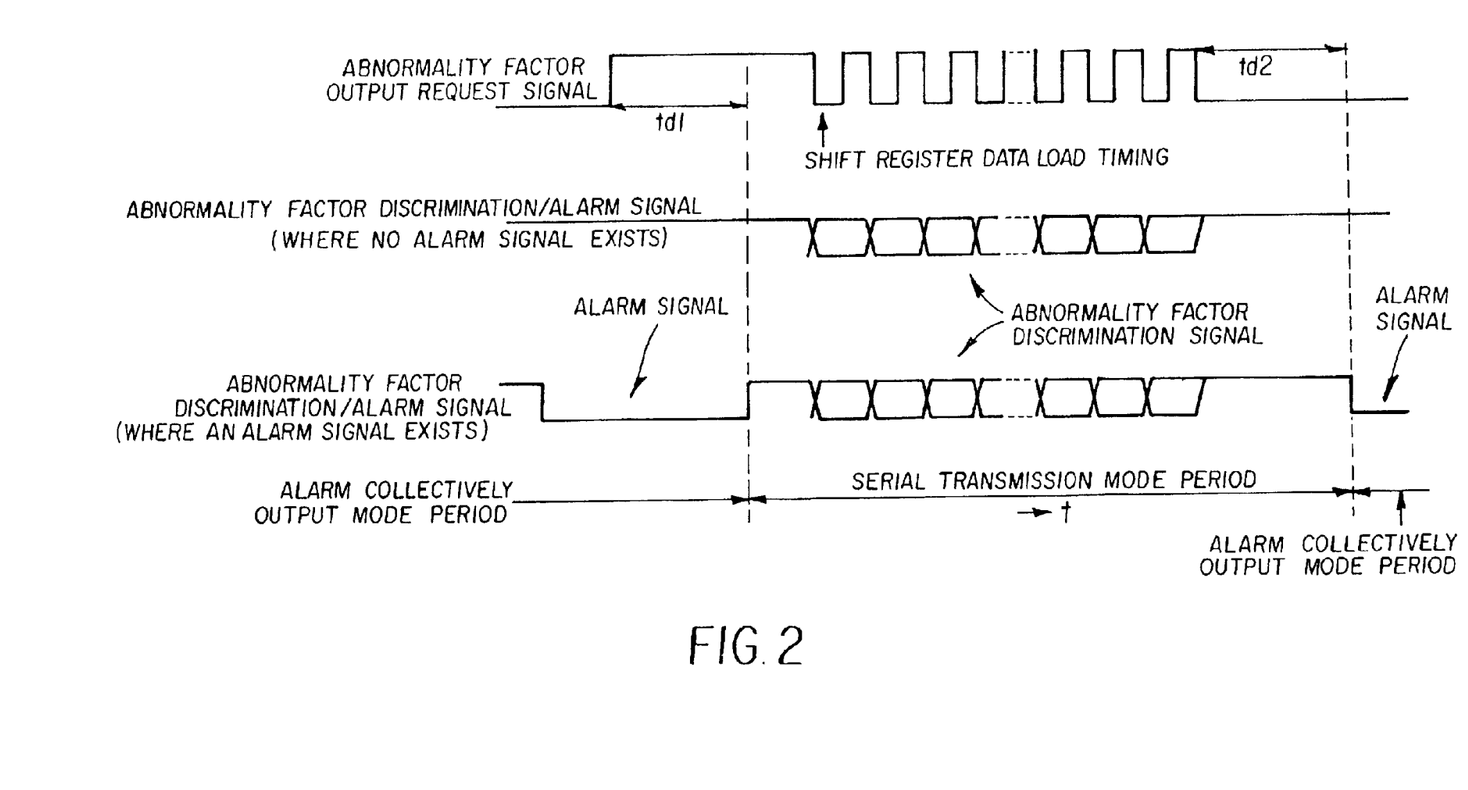
FIG. 2 is a timing chart showing the operation of an IPM alarm signal according to the second embodiment of the present invention.

FIGS. 2(a)–2(c) are timing charts showing the timings of an abnormality factor output request signal and an abnormality factor discrimination/alarm signal according to the present embodiment. FIG. 2(a) is a timing chart showing the abnormality factor output request signal inputted from the input terminal 120 in FIG. 1. FIG. 2(b) is a timing chart showing the abnormality factor discrimination/alarm signal in the case where no alarm signal exists. FIG. 2(c) is a timing chart showing the abnormality factor discrimination/alarm signal in the case where an alarm signal exists.

Referring to FIG. 2, at a rising edge of the abnormality factor output request signal, the abnormal condition detecting signal, which should be transmitted to a parallel-in/serial-out shift register for serial transmission in the transmission circuit 110, is shifted. At a falling edge of the abnormality factor output request signal, the abnormal condition detecting signal (abnormality factor discrimination signal) is read by the system. A transmission preparation signal (start signal), which has a longer cycle than a clock cycle (e.g. between 1 $\mu$s and 100 $\mu$s) of a read signal, is added to the beginning of the abnormality factor output request signal. If the abnormality factor output request signal continues to be high for a predetermined period of time ($t_{d1}$: e.g. 200 $\mu$s) or longer, a serial transmission mode starts. At the following falling edge of the abnormality factor output request signal, the abnormality factor discrimination signals latched by the control circuits 91, 92 are read into the shift register in the transmission circuit 110. The purpose of updating the data in the shift register just before the transmission is to prevent the serial signal from shifting bit by bit in the case where the abnormality factor output request signal is read by mistake due to noises when no abnormality factor output request signal exists.

Referring to FIG. 2, when the falling edge of the abnormality factor output request signal is detected, the data in the parallel-in/serial-out shift register in the transmission circuit 110 are shifted bit by bit and are sequentially outputted as abnormality factor discrimination signals to the alarm signal output terminal 130. The system, not shown, reads a signal from the alarm signal output terminal 130 at the rising edge of the abnormality factor output request signal to thereby recognize which phase is exposed to what kind of abnormal condition (the fatal abnormal condition indicated by the alarm signal or the precursory abnormal condition indicated by the warning signal).

If all the data in the parallel-in/parallel-out shift register have been outputted, or if the abnormality factor output request signal has continued to be low for a predetermined period of time ($t_{d2}$: e.g. 200 $\mu$s) or longer, the serial transmission mode is canceled and shifts to an alarm collectively output mode. The alarm collectively output mode is a conventional mode in which alarm signals of one kind are collectively outputted without classifying the abnormality factors. That is, the alarm collectively output mode is set as long as no abnormality output request signal is inputted.

In the alarm collectively output mode, if at least one abnormal condition detecting signal (alarm signal) indicating the fatal abnormal condition exists in the data latched by the control circuits 91, 92, a "Low" level signal is outputted to the alarm signal output terminal 130. In an example shown in FIG. 2(c) (where the alarm signal exists), an abnormal condition to be alarmed is developed before the abnormality factor output request signal is inputted, and the abnormal condition continues thereafter.

More specifically, the alarm signal indicating the fatal abnormal condition is outputted irrespective of whether the abnormality factor output request signal exists or not. The abnormality factor discrimination signals relating to all the abnormal condition detecting signals including the alarm signals and the warning signals are not outputted until the abnormality factor output request signal is inputted.

With the above arrangement of the present embodiment, if no abnormality factor output request signal is inputted or if this signal is not held for a predetermined period of time or longer, the abnormality factor discrimination signals are outputted upon the input of the abnormality factor output request signal in the alarm collectively output mode as is the case with the conventional IPM. Therefore, the IPM of the present embodiment is compatible with the conventional IPM in respect of an alarm signal output function. If the abnormality factor output request signal is inputted and is held for a predetermined period of time or longer, the abnormality factor discrimination signals can be transmitted to the system in the serial transmission mode.

According to the present embodiment, the alarm signal output terminal 130 is used for outputting both the alarm signals and the abnormality factor discrimination signals. Alternatively, however, separate output terminals may be used for outputting those signals.

Figure 3:
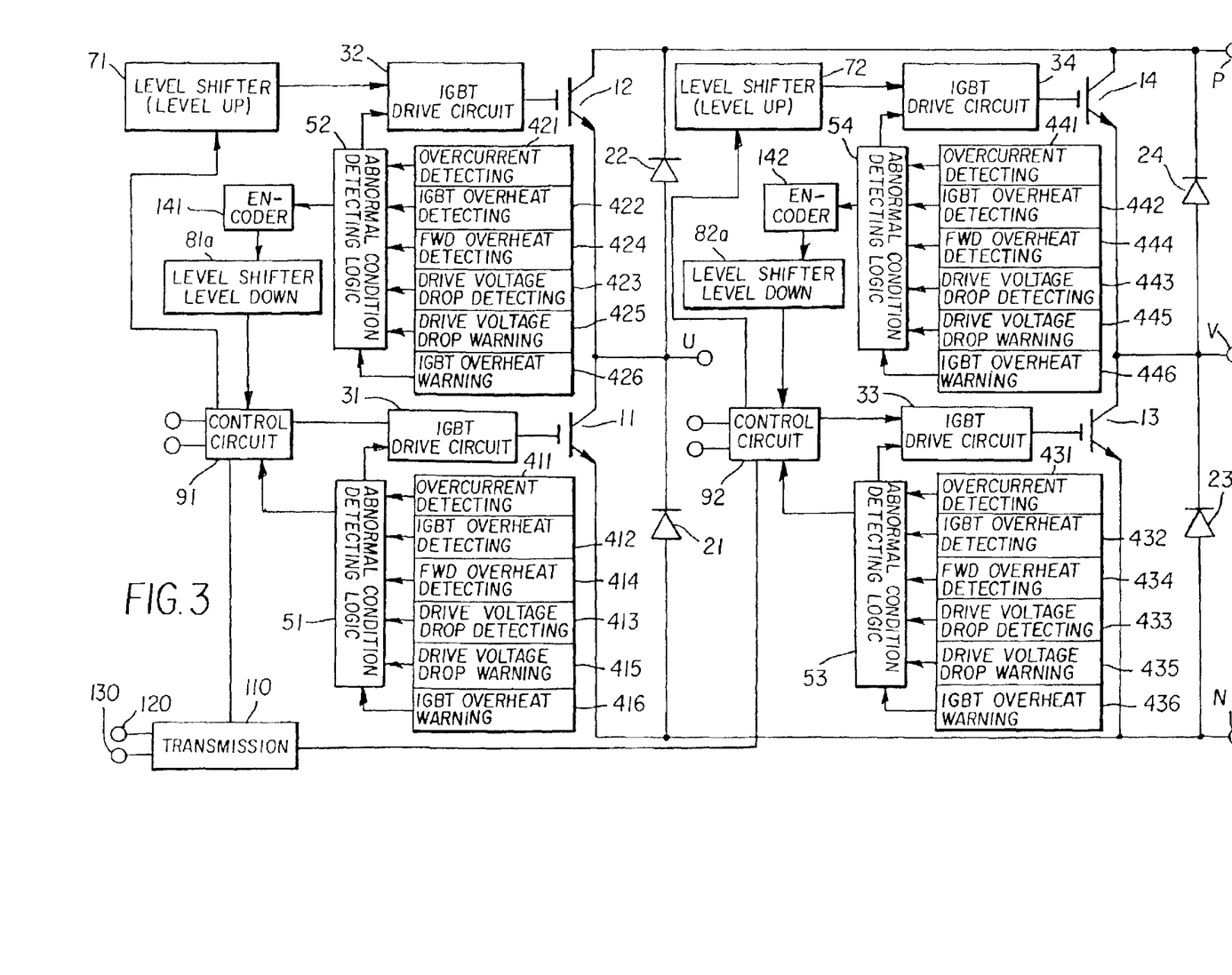
FIG. 3 is a block diagram of an IPM in accordance with the second embodiment of the present invention.

FIG. 3 shows an intelligent power module according to the second embodiment of the present invention. The construction of this embodiment is identical with that of the first embodiment in FIG. 1 except that encoders 141, 142 are provided between the abnormal condition detecting logic devices 52, 54 and the level shifters 81a, 82a in the upper arm.

According to the present embodiment, encoders 141, 142 encode the abnormal condition detecting signals outputted from the abnormal condition detecting logic devices 52, 54. The encoded abnormal condition detecting signals are transmitted to the level shifters 81a, 82a, and are then parallel transmitted to the respective control circuits 91, 92. Although not illustrated, a decoder is provided in the control circuits 91, 92 or the transmission circuit 110.

According to the first embodiment shown in FIG. 1, the abnormal condition detecting signals relating to the respective abnormality factors are separately transmitted to the level shifters 81, 82 through the abnormal condition detecting logic devices 52, 54. This necessitates constructing the level shifters 81, 82 correspondingly to the number of abnormal condition detecting signals. According to the present embodiment, however, the encoders 141, 142 encode a variety of abnormal condition detecting signals and transmit them to the level shifters 81a, 82a. The level shifters 81a, 82a then transmit the abnormal condition detecting signals as parallel signals. Therefore, the present embodiment simplifies the circuit arrangement of the level shifters 81a, 82a compared to the circuit arrangement shown in FIG. 1.

Figure 4:
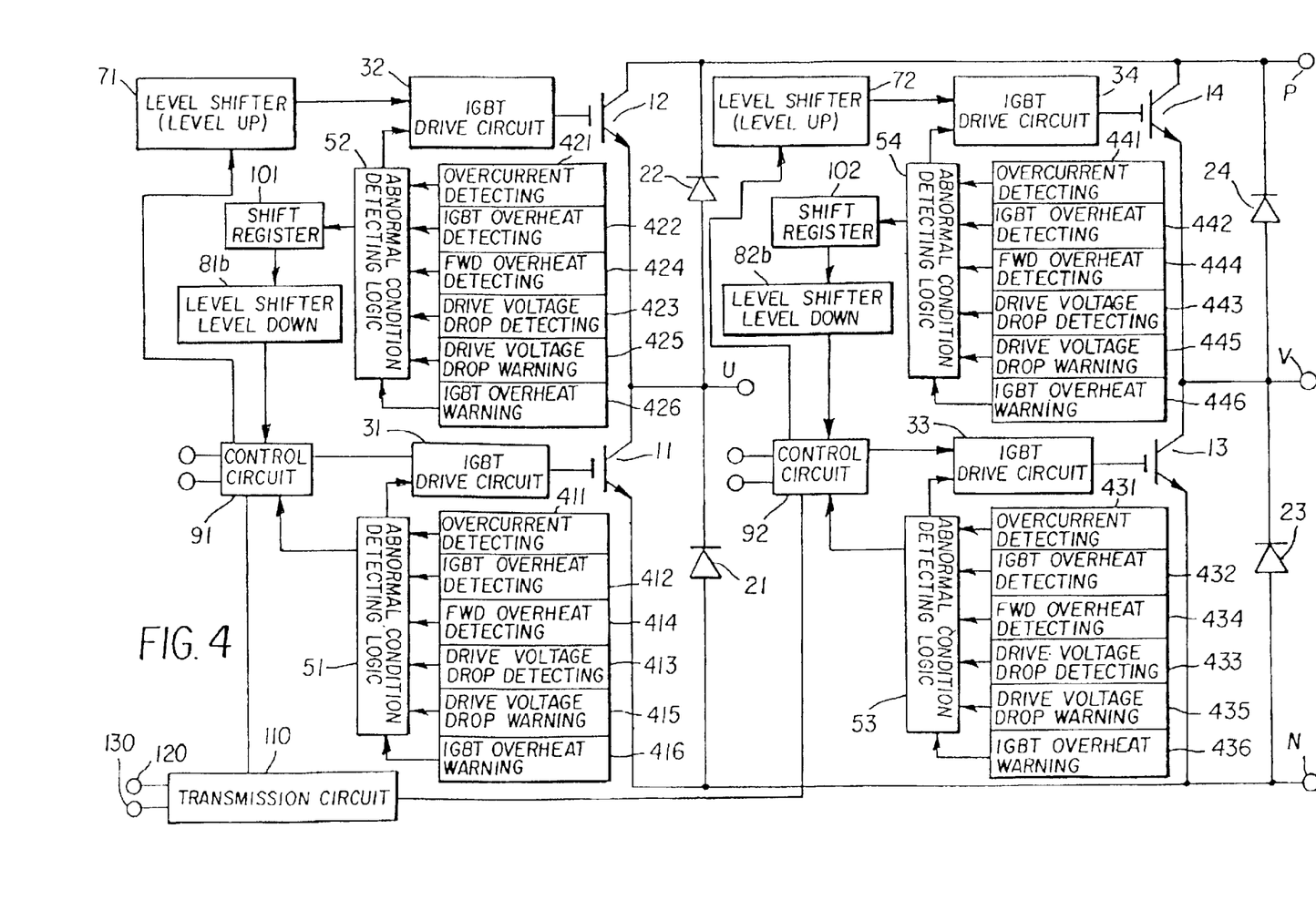
FIG. 4 is a block diagram of an IPM in accordance with the third embodiment of the present invention.

FIG. 4 shows the third embodiment of the present invention. The construction of this embodiment is identical with that of the first embodiment in FIG. 1 except that parallel-in/parallel-out shift registers 101, 102 are provided between the abnormal condition detecting logic devices 51, 54 and the level shifters 81b, 82b in the upper arm.

According to the present embodiment, the shift registers 101, 102 convert the abnormal condition detecting signals in the upper arm from parallel form to serial form, and serial-in/parallel-out registers in the level shifters 81b, 82b reconvert them from serial form to parallel form. The converted signals are transmitted to and latched by the control circuits 91, 92.

According to the present embodiment, the parallel-in/serial-out shift registers 101, 102 convert the abnormal condition detecting signals into serial signals, which are inputted to the level shifters 81b, 82b. This simplifies the circuit arrangement of the level shifters 81b, 82b compared to the first embodiment shown in FIG. 1, and is particularly advantageous in the case where a large number of abnormal condition detecting signals exist.

An oscillator may be provided in the upper arm so that clock pulses thereof can be used as shift clocks of the abnormal condition detecting signals in the shift registers 101, 102. Alternatively, however, the control circuits 91, 92 may generate pulses in synchronism with ON pulses or OFF pulses of the IGBTs 12, 14 and transmit the generated pulses to the shift registers 101, 102 through the level shifters 81b, 82b.

Figure 7:
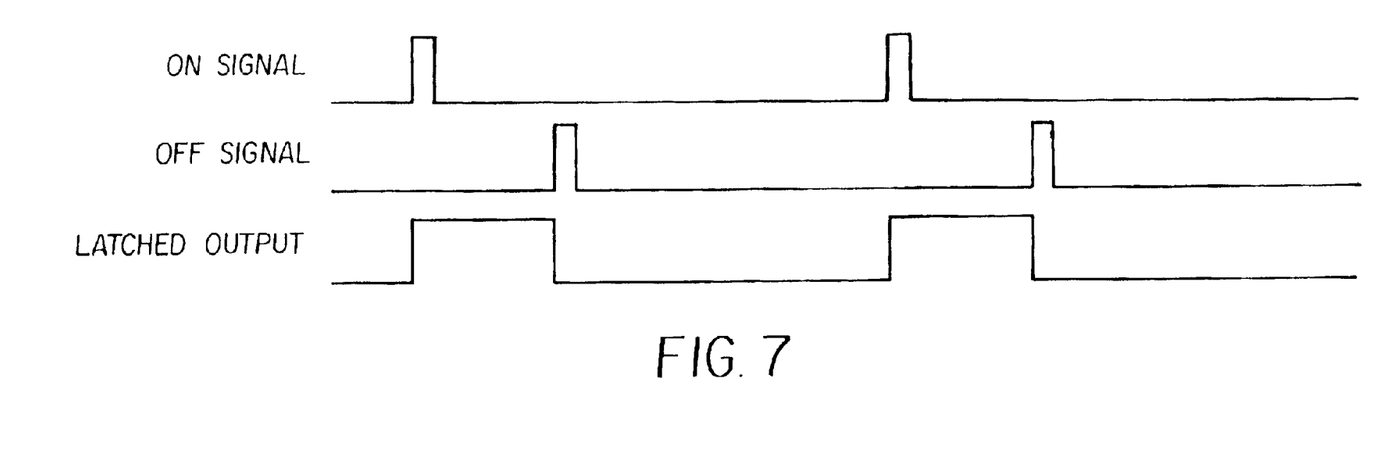
FIG. 7 is a timing chart of level shift signals of the control circuits.

A description will now be given of the case where the control circuits 91, 92 generate the pulses in synchronism with the OFF pulses. Normally, the level shift signals are converted into ON signals and OFF signals to be transmitted as shown in FIG. 7 in order to reduce losses, and are reconverted into condition signals by latching. Therefore, if no ON signal (or OFF signal) is transmitted, there is no change in the reconverted signals as latched output irrespective of number of times that the OFF signal (or the ON signal) is transmitted. Thus, pulses in number corresponding to the number of abnormality factor discrimination signals (four signals in FIG. 8) that should be transmitted are applied to the OFF signal and are used as the shift clocks of the shift registers 101, 102. In this case, it is easy to read the data in the lower arm because the timings of the shift clocks in the lower arm are clear.

Figure 8:
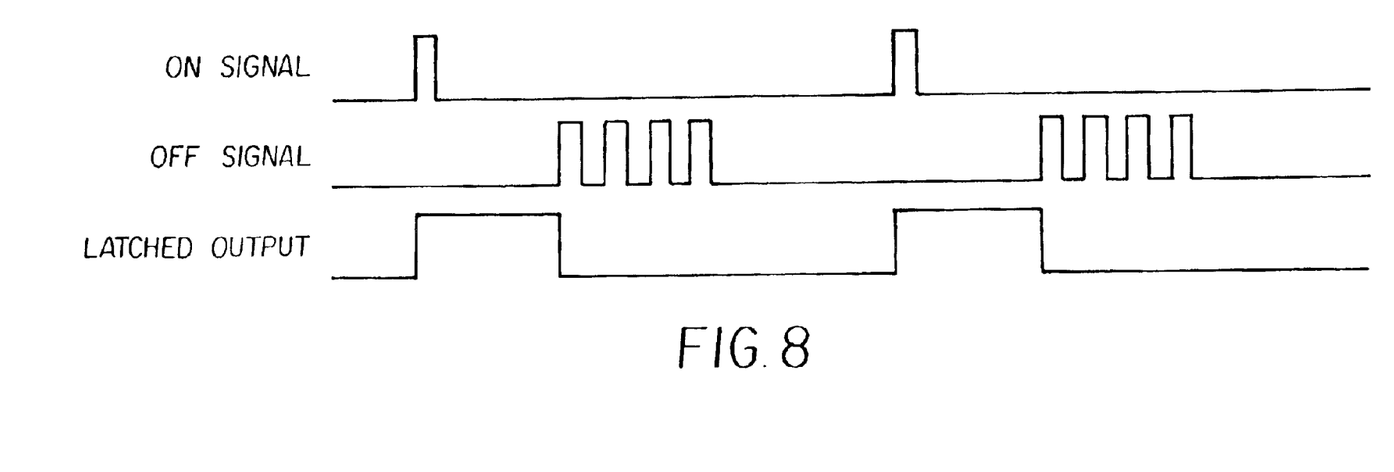
FIG. 8 is a timing chart of level shift signals of the control circuits.

If the ON pulse is transmitted during the transmission of the OFF pulse, the transmission of the OFF pulse is stopped to invalidate the abnormality factor discrimination signals transmitted from the upper arm. This makes it possible to maintain the reconverted signals in the upper arm in a normal condition and prevent the abnormality factors from being read by mistake.

In the above case, it is advantageous to pulse the abnormality factor discrimination signals transmitted from the upper arm in order to reduce losses.

According to the first through third embodiments described above, the IPM is compatible with the conventional system that outputs only one kind of alarm signals, and is also capable of outputting the abnormality factor discrimination signal as the need arises. Moreover, the IPM is able to quickly take proper measures against the abnormality factors to protect the devices, etc. when the fatal abnormal condition or the precursory abnormal condition is developed. In particular, outputting the factors contributing to the precursory abnormal condition can effectively prevent the shutdown of the system.

The first through third embodiments have the secondary effect as follows. The use of the drive voltage drop warning circuit prevents malfunctions resulting from a change in drive voltage with time, and shortens a period of time that the level shift signals are transmitted by a low-pass filter, etc. Moreover, the simplification of the level shifters enables reduction in power that is consumed by the level shifters.

According to the first through third embodiments stated above, the alarm signals and the abnormality factor discrimination signals are serial transmitted from the alarm signal output terminal 130 of the transmission circuit 110, but this has a problem in that a circuit for serial transmitting the signals and a circuit for receiving and decoding the serial signals have a complicated circuit arrangement. This increases a total cost. To address this problem, according to the present embodiment, the alarm signals and the warning signals are outputted separately, and the abnormality factors are discriminated according to combinations of the output signals.

Figure 5:
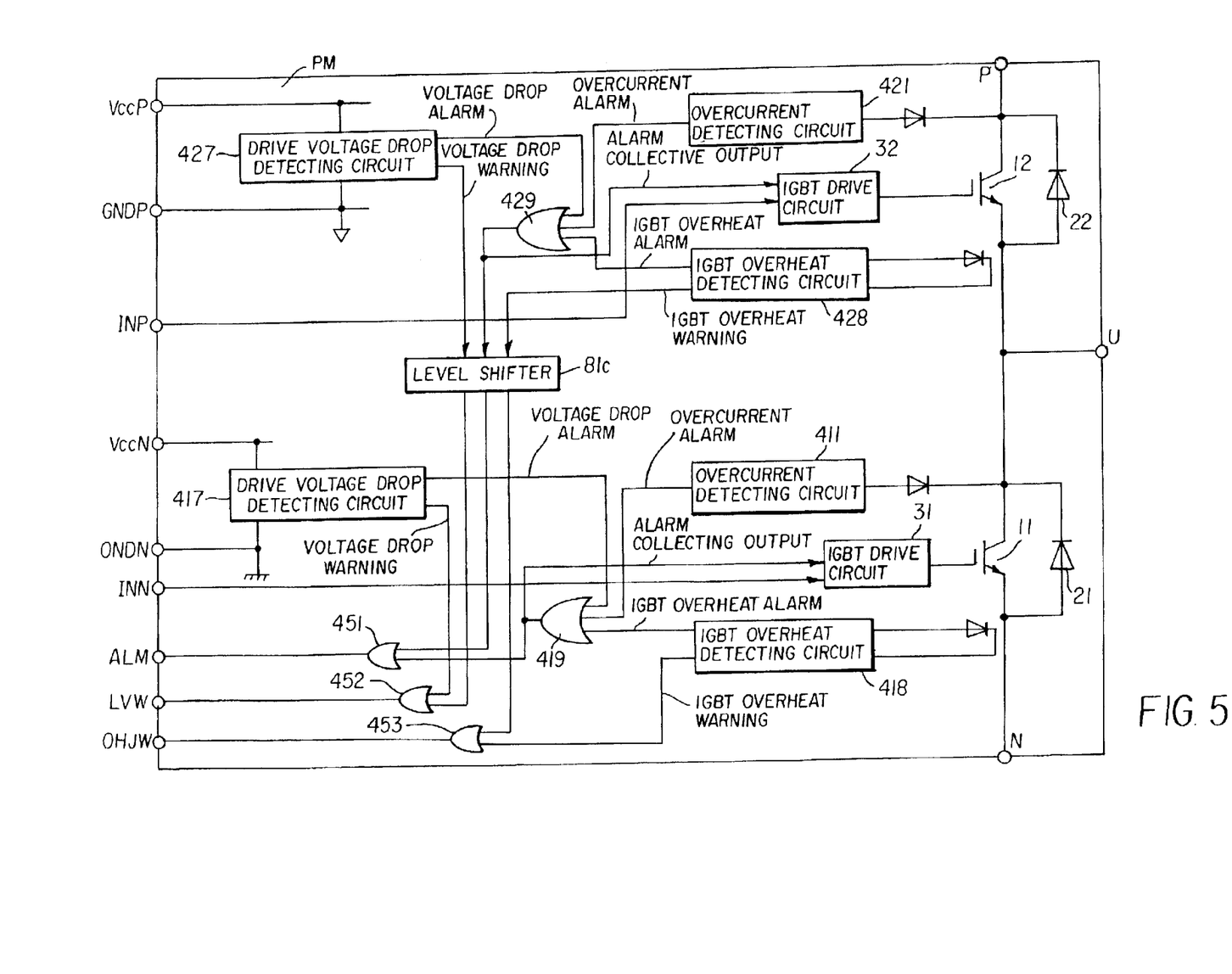
FIG. 5 is a block diagram of an IPM in accordance with the fourth embodiment of the present invention.

FIG. 5 shows the fourth embodiment of the present invention. In FIG. 5, parts similar to those of the first through third embodiments are denoted by the same reference numerals. FIG. 5 shows an upper arm and a lower arm in only one phase, but arms in the other phases are constructed in the same manner.

In the intelligent power module according to the present embodiment, a drive voltage drop detecting circuit 417 has the functions of both the drive voltage drop detecting circuit 413 and the drive voltage drop warning circuit 415 according to the first through third embodiments. Likewise, a drive voltage drop detecting circuit 427 has the functions of both the drive voltage drop detecting circuit 423 and the drive voltage drop warning circuit 425 according to the first through third embodiments.

An IGBT overheat detecting circuit 418 has the functions of the IGBT overheat detecting circuit 412 and the IBGT overheat warning circuit 416 according to the first through third embodiments. Likewise, an IGBT overheat detecting circuit 428 has the functions of the IGBT overheat detecting circuit 422 and the IBGT overheat warning circuit 426 according to the first through third embodiments.

An OR gate 429 in the upper arm receives an overcurrent alarm signal from the overcurrent detecting circuit 421, an IGBT overheat alarm signal from the IGBT overheat detecting circuit 428, and a voltage drop alarm signal from the drive voltage drop detecting circuit 427. Output signals from the OR gate 429 are supplied to the IGBT drive circuit 32 and one input terminal of an OR gate 451 through a high voltage level shifter 81c.

Similarly, an OR gate 419 in the lower arm receives an overcurrent alarm signal from the overcurrent detecting circuit 411, an IGBT overheat alarm signal from the IGBT overheat detecting circuit 418, and a voltage drop alarm signal from the drive voltage drop detecting circuit 417. Output signals from the OR gate 419 are supplied to the IGBT drive circuit 32 and the other input terminal of the OR gate 451.

The IGBT drive circuits 31, 32 receive respective control signals from external control circuits through terminals INN, INP thereof.

The voltage drop warning signal outputted from the drive voltage drop detecting circuit 427 in the upper arm is supplied to one input terminal of the OR gate 452 through the level shifter 81c, and the voltage drop warning signal outputted from the drive voltage drop detecting circuit 417 in the lower arm is supplied to the other input terminal of the OR gate 452.

The IGBT overheat warning signal outputted from the IGBT overheat detecting circuit 428 in the upper arm is supplied to one input terminal of an OR gate 453, and the IGBT overheat warning signal outputted from the IGBT overheat detecting circuit 418 in the lower arm is supplied to the other input terminal of the OR gate 453.

An output signal from the OR gate 452 is outputted as a voltage drop warning signal from an output terminal LVW, and an output signal from the OR gate 453 is outputted as an IGBT overheat warning signal from an output terminal OHJW.

The warning signal is transmitted to the outside to indicate the precursory abnormal condition without cutting off the IGBTs 11, 12 before the drop in drive voltage or the temperature of the IGBT reaches the fatally abnormal level as stated previously, thus urging the system to stop running a load (e.g. an alternating-current motor).

According to the present embodiment described above, three kinds of signals are outputted from the output terminals ALM, LVW and OHJW (one kind of alarm signals and two kinds of warning signals), and a failure is analyzed according to combinations of logic states "1" and "0" of the respective signals (eight kinds of combinations) as shown in Table 1.

The logic state "1" means an abnormal condition, and the logic state "0" means no abnormal condition.

TABLE 1

| ALM | LVW | OHJW | Failure Analysis |
|---|---|---|---|
| 0 | 0 | 0 | IPM is normal |
| 0 | 0 | 1 | The temperature of one of devices in the upper or lower arm is abnormal. There is a danger of tripping. |
| 0 | 1 | 0 | One of control power supplies in upper and lower arms is abnormal. There is a danger of tripping. |
| 0 | 1 | 1 | The temperature of one of devices and one of control power sources in upper and lower arms are abnormal. There is a danger of tripping. |
| 1 | 0 | 0 | One of devices in upper and lower arms has self-tripped due to overcurrent. |
| 1 | 0 | 1 | One of devices in upper and lower arms has self-tripped due to overheating. |
| 1 | 1 | 0 | One of devices in upper and lower arms has self-tripped due to drop in voltage of a control power supply. |
| 1 | 1 | 1 | One of devices in upper and lower arms has self-tripped due to overheating as well as drop in voltage of a control power supply. |

In the Table 1, if the logic states of the respective output signals from the output terminals ALM, LVW and OHJW are "1", "0" and "1", the alarm signal and the IGBT overheat warning signal are generated at the same time. Accordingly, it is assumed that one of the IGBTs 12, 11 in the upper and lower arms has self-tripped due to overheating. If the logic states of the respective output signals are "1", "0" and "0", neither the drive voltage drop warning signal nor the IGBT overheat warning signal are generated. Accordingly, it is assumed that one of the IGBTs 12, 11 in the upper and lower arms has self-tripped due to overcurrent. In either case, the condition is fatally abnormal.

Regarding other combinations of logic states, the analysis as shown in the Table 1 can be performed in the similar manner. Particularly if the logic state of the alarm signal is "0" and the logic state of one warning signals is "1", it can be assumed that there are precursory abnormality factors, which are not contributing to the fatal abnormal condition at present but will develop the fatal abnormal condition if no action is taken. This is very advantageous in protection of devices, etc.

According to the fourth embodiment, the alarm signals and the abnormality factor discrimination signals are not outputted as serial signals from a single output terminal unlike the first through third embodiments, but the alarm signal and the warning signal are outputted from separate output terminals so that the abnormality factors can be discriminated according to the combinations of logic states of the output signals. The fourth embodiment thus eliminates the necessity of arranging the circuit in such a manner as to output the signals in serial form, and therefore makes it possible to take proper measures to protect the devices, etc. at the precursory stage of the fatal abnormal condition.

The level shifter 81c and the OR gates 451 to 453 shown in FIG. 5 may be omitted, in accordance with another embodiment of the invention. More specifically, the alarm signal, the voltage drop warning signal and the IGBT overheat warning signal may be generated only in the upper and lower arms, and the failures may be analyzed or the abnormality factors may be discriminated according to the combinations of logic states of those signals.

As set forth hereinabove, according to the present invention, the alarm signals are outputted to indicate the fatal abnormal condition and the abnormality factors contributing to the fatal abnormal condition and the precursory abnormal condition. Therefore, the IPM is compatible with the conventional system and is able to protect the devices, the drive circuits and so forth in a refined manner.

Moreover, the abnormality factors can be discriminated without providing a number of output terminals. This reduces the number of insulated type signal transmission devices such as photo-couplers, and thus provides the IPM at a reduced cost.

What is claimed is:

1. An intelligent power module comprising:

power semiconductor switching devices;

driving means for driving said switching devices;

abnormal condition detecting means for detecting a fatal abnormal condition and a precursory abnormal condition thereof in said switching devices or said driving means;

protecting means for protecting said switching devices when said abnormal condition detecting means detects the abnormal condition; and abnormal condition output means for outputting signals based on abnormal condition detecting signals outputted from said abnormal condition detecting means to outside;

wherein said abnormal condition output means comprises:

at least one output terminal for outputting alarm signals when said abnormal condition detecting means detects the fatal abnormal condition and for outputting abnormality factor discrimination signals indicating abnormality factors contributing to the fatal a normal condition and the precursory abnormal condition.

2. An intelligent power module according to claim 1, wherein said a normality factor discrimination signals are outputted as serial signals.

3. An intelligent power module according to claim 1, wherein said at least one output terminal for outputting the alarm signals and for outputting the abnormality factor discrimination signals are the same terminal.

4. An intelligent power module according to claim 1, further including at least one input terminal for inputting an abnormality factor, output request signal from outside, and wherein:

said abnormality factor discrimination signals are outputted in synchronism with the abnormality factor output request signal inputted from outside.

5. An intelligent power module according to claim 4, wherein:
said abnormality factor output request signal includes a transmission reparation signal having a predetermined cycle, said transmission preparation signal updating the abnormality factor discrimination signals stored in parallel-in/serial-out shift registers in said abnormal condition output means, and a read clock following said transmission preparation signal causes said shift registers to output the abnormality factor discrimination signals.

6. An intelligent power module comprising:

power semiconductor switching devices;

driving means for driving said switching devices;

abnormal condition detecting means for detecting a fatal abnormal condition and a precursory abnormal condition thereof in said switching devices or said driving means;

protecting means for protecting said switching devices when said abnormal condition detecting means detects the abnormal condition;

at least one input terminal for inputting an abnormality factor output request signal from outside; and abnormal condition output means for outputting signals based on abnormal condition detecting signals outputted from said abnormal condition detecting means to outside, wherein said abnormal condition output means comprises at least one output terminal for outputting alarm signals when said abnormal condition detecting means detects the fatal abnormal condition and for outputting abnormality factor discrimination signal indicating abnormality factors contributing to the fatal abnormal condition and the precursory abnormal condition, wherein if said fatal abnormal condition is developed, said abnormal condition output means outputs alarm signals irrespective of whether said abnormality factor output request signal exists or not, and if said precursory abnormal condition is developed, said abnormal condition output means outputs the abnormality factor discrimination signals separately in time in synchronism with said abnormality factor output request signal.

7. An intelligent power module according to claim 1, wherein:
if said fatal abnormal condition is developed, said abnormal condition detecting means cuts off said semiconductor switching devices through said driving means.

8. An intelligent power module according to claim 1, wherein:
said semiconductor switching devices are connected in single-phase bridge connection.

9. An intelligent power module according to claim 1, wherein:
said semiconductor switching devices are connected in three-phase bridge connection.

10. An intelligent power module comprising:

power semiconductor switching devices;

driving means for driving said switching devices;

abnormal condition detecting means for detecting a fatal abnormal condition and a precursory abnormal condition thereof in said switching devices or said driving means;

protecting means for protecting said switching devices when said abnormal condition detecting means detects the abnormal condition; and abnormal condition output means for outputting signals based on abnormal condition detecting signals outputted from said abnormal condition detecting means to outside, wherein said abnormal condition output means comprises at least on output terminal for outputting alarm signals when said abnormal condition detecting means detects the fatal abnormal condition and for outputting abnormality factor discrimination signal indicating abnormality factors contributing to the fatal abnormal condition and the precursory abnormal condition, wherein said semiconductor switching devices are connected in single-phase bridge connection and wherein the abnormal condition detecting signals from said abnormal condition detecting means corresponding to semiconductor switching devices connected in bridge connection in an upper arm are transmitted to a lower arm through high voltage level shifters.

11. An intelligent power module according to claim 10, wherein:
said high voltage level shifters perform parallel transmission of multiple abnormal condition detecting signals.

12. An intelligent power module according to claim 10, wherein:
said multiple abnormal condition detecting signals are encoded and are parallel transmitted by said high voltage level shifters.

13. An intelligent power module according to claim 10, wherein:
said multiple abnormal condition detecting signals are converted into serial signals and are serial-transmitted by said high voltage level shifters.

14. An intelligent power module comprising:

power semiconductor switching devices;

driving means for driving said switching devices;

abnormal condition detecting means for detecting a fatal abnormal condition and a precursory abnormal condition thereof in said switching devices or said driving means;

protecting means for protecting said switching devices when said abnormal condition detecting means detects the abnormal condition; and abnormal condition output means for outputting signals based on abnormal condition detecting signals outputted from said abnormal condition detecting means to outside, wherein said abnormal condition output means comprises at least one output terminal for outputting alarm signals when said abnormal condition detecting means detects the fatal abnormal condition and for outputting abnormality factor discrimination signal indicating abnormality factors contributing to the fatal abnormal condition and the precursory abnormal condition, wherein said semiconductor switching devices are connected in three-phase bridge connection and wherein the abnormal condition detecting signals from said abnormal condition detecting means corresponding to semiconductor switching devices connected in bridge connection in an upper arm are transmitted to a lower arm through high voltage level shifters.

15. An intelligent power module according to claim 14, wherein:
said high voltage level shifters perform parallel transmission of multiple abnormal condition detecting signals.

16. An intelligent power module according to claim 14, wherein:

said multiple abnormal condition detecting signals are encoded and are parallel transmitted by said high voltage level shifters.

17. An intelligent power module according to claim 14, wherein:

said multiple abnormal condition detecting signals are converted into serial signals and are serial-transmitted by said high voltage level shifters.

18. An intelligent power module comprising:

power semiconductor switching devices;

driving means for driving said switching devices;

abnormal condition detecting means for detecting a fatal abnormal condition and a precursory abnormal condition thereof in said switching devices or said driving means;

protecting means for protecting said switching devices when said abnormal condition detecting means detects the abnormal condition; and abnormal condition output means for outputting signals based on abnormal condition detecting signals outputted from said abnormal condition detecting means to outside;

wherein said abnormal condition output means comprises:

at least one output terminal for outputting alarm signals when said abnormal condition detecting means detects the fatal abnormal condition and at least one output terminal for outputting warning signals when said abnormal condition detecting means detects the precursory abnormal condition; and wherein abnormality factors are discriminated according to combinations of output signals from said output terminals.

19. An intelligent power module according to claim 18, wherein:

said semiconductor switching devices are connected in bridge connection, and said alarm signals are generated by obtaining a logical sum of the abnormal condition detecting signals indicating the fatal abnormal condition from said abnormal condition detecting means corresponding to the semiconductor switching devices in an upper arm and the abnormal condition detecting signals indicating the fatal abnormal condition from said abnormal condition detecting means corresponding to the semiconductor switching devices in a lower arm; and said warning signals are generated by obtaining a logical sum of the abnormal condition detecting signals indicating the precursory abnormal conditions from said abnormal condition detecting means corresponding to the semiconductor switching devices in the upper arm and the abnormal condition detecting signals indicating the precursory abnormal condition from said abnormal condition detecting means corresponding to the semiconductor switching devices in the lower arm.

* * * * *